US012784829B2

(12) United States Patent
Chen et al.

(10) Patent No.: US 12,784,829 B2
(45) Date of Patent: Nov. 3, 2026

(54) METHOD FOR STORING DATA AND OPTICAL STORAGE

(71) Applicant: The Chinese University of Hong Kong, Hong Kong (CN)

(72) Inventors: Shih-Chi Chen, Hong Kong (CN); Fei Han, Hong Kong (CN); Songyun Gu, Hong Kong (CN)

(73) Assignee: The Chinese University of Hong Kong, Hong Kong (CN)

( * ) Notice: Subject to any disclaimer, the term of this patent is extended or adjusted under 35 U.S.C. 154(b) by 672 days.

(21) Appl. No.: 18/156,899

(22) Filed: Jan. 19, 2023

(65) Prior Publication Data

US 2024/0249771 A1 Jul. 25, 2024

(51) Int. Cl.
*G11C 13/04* (2006.01)
*G03F 7/004* (2006.01)
*G03F 7/26* (2006.01)

(52) U.S. Cl.
CPC ............ *G11C 13/042* (2013.01); *G03F 7/004* (2013.01); *G03F 7/26* (2013.01)

(58) Field of Classification Search
CPC ......... G11C 13/042; G03F 7/004; G03F 7/26; G11B 7/257; G11B 7/24065
USPC .......................................................... 430/269
See application file for complete search history.

(56) References Cited

U.S. PATENT DOCUMENTS

| | | | |
|---|---|---|---|
| 2013/0245402 A1 | 9/2013 | Ziaie et al. | |
| 2015/0087945 A1 | 3/2015 | Ziaie et al. | |
| 2018/0248070 A1* | 8/2018 | Farah | H10F 71/1272 |
| 2021/0371782 A1 | 12/2021 | Parker et al. | |
| 2022/0002790 A1* | 1/2022 | Kishi | C12Q 1/6813 |
| 2022/0152924 A1* | 5/2022 | Chen | B29C 64/106 |

FOREIGN PATENT DOCUMENTS

| | | |
|---|---|---|
| CN | 110625933 A | 12/2019 |
| CN | 113637185 A | 11/2021 |
| KR | 20190088423 A | 7/2019 |

OTHER PUBLICATIONS

Si (Year: 2019).*

* cited by examiner

*Primary Examiner* — Caleen O Sullivan
(74) *Attorney, Agent, or Firm* — Seed Intellectual Property Law Group LLP

(57) ABSTRACT

In this application, a 2D or 3D optical storage and a physical encryption method with ultrahigh storage density are presented. Designed information patterns can be written in an expanded hydrogel via laser patterning, followed by volume shrinkage and dehydration of the hydrogel to achieve physical encryption, ultrahigh storage density, and long-term storage. For decryption, the dehydrated gel is re-expanded, and then immersed in a solution of fluorescent materials to retrieve the stored information via an imaging system.

10 Claims, 5 Drawing Sheets

METHOD FOR STORING DATA AND OPTICAL STORAGE

TECHNICAL FIELD

Embodiments of the present disclosure relate generally to the field of information storage. More particularly, embodiments of the disclosure relate to a method for storing data and an optical storage.

BACKGROUND

With the growing demand for digital information storage, the optical storage that stores information in optically readable media has attracted great interests. The information is recorded by making designed marks in a substrate that can be read out via optical methods. Due to the limit of storage density in a planar or 2D fashion, 3D optical storage that volumetrically stores the data is generally believed to be the next-generation data storage solution.

SUMMARY

In an aspect of the disclosure, a method of optically writing, encrypting, and storing data is provided. The method includes: patterning a hydrogel by illuminating a laser on the hydrogel; and shrinking the patterned hydrogel to encrypt and store the data.

In another aspect of the disclosure, an optical storage is provided. The optical storage includes a hydrogel with a pattern, where the hydrogel is expandable.

BRIEF DESCRIPTION OF THE DRAWINGS

Embodiments of the disclosure are illustrated by way of example and not limitation in the figures of the accompanying drawings in which like references indicate similar elements.

DETAILED DESCRIPTION

Figure 1:
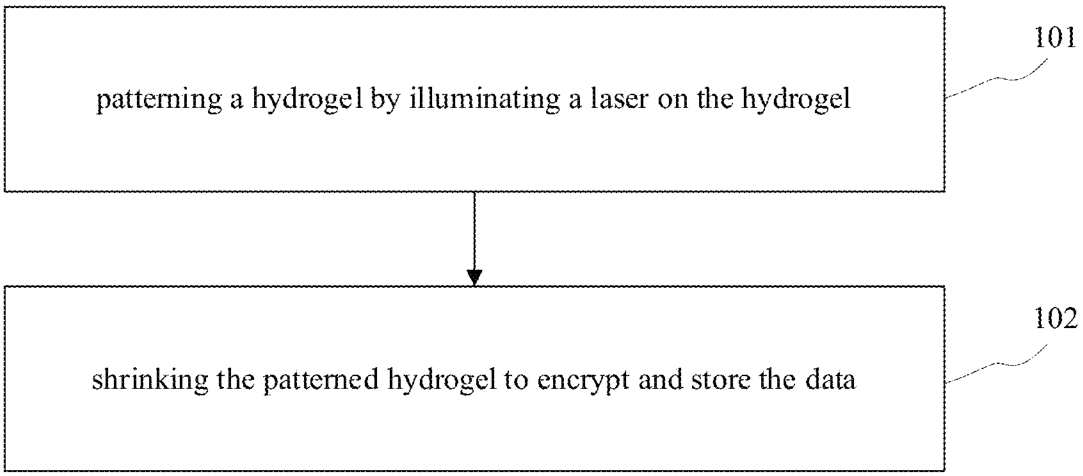
FIG. 1 illustrates a flow chart of a method for writing and storing data according to some embodiments of the disclosure.

Various embodiments and aspects of the disclosures will be described with reference to details discussed below, and the accompanying drawings will illustrate the various embodiments. The following description and drawings are illustrative of the disclosure and are not to be construed as limiting the disclosure. Numerous specific details are described to provide a thorough understanding of various embodiments of the present disclosure. However, in certain instances, well-known or conventional details are not described in order to provide a concise discussion of embodiments of the present disclosures.

It should also be noted that the embodiments in the present disclosure and the features in the embodiments may be combined with each other on a non-conflict basis. The present disclosure will be described below in detail with reference to the accompanying drawings and in combination with the embodiments.

In the related art, the high peak intensity of a fs laser can induce nonlinear interactions within a hard transparent material, such as multiphoton absorption, multiphoton ionization, avalanche ionization, etc. These interactions can be exploited to generate nanopores or nano-gratings in the substrate, which exhibit optical contrast (i.e., modified refractive index (RI)) to the surrounding medium. Thus, designed information can be optically stored. Various hard transparent materials have been used as the storage medium with a maximum storage density of 500 Gbit/cm$^3$, e.g., polymers, silica, quartz, sapphire, and glasses. The method according to some embodiments of the disclosure can achieve a high optical storage density (i.e., >100 Pbit/cm$^3$). Due to the requirement for fs-laser pulse accumulation (>10 pulses) to induce local defects such as nanopores or nano-gratings, the write-in speeds of methods in related art are typically slow. In contrast, by combining with suitable optical system, the method according to some embodiments of the disclosure could directly write a large 2D information pattern of ~10$^4$ μm$^2$ m with a single fs pulse, which speeds up the writing speed by over three orders of magnitude. In terms of lifetime, some of the hard storage mediums may have shrinkage-induced performance reductions during long-term storage. In addition, such storage media cannot be directly encrypted, which greatly reduces the safety of the stored information. The method according to some embodiments of the disclosure can effectively resolve these problems.

In the related art, besides modifying RI, using fluorescent materials as the storage media for elevated reading accuracy is another adopted approach, such as multi-photon modification of dye doped polymers, rare-earth doped glasses, and photo-bleaching/reduction/enhancement of fluorescent materials, etc. The methods in the related art essentially use a laser to selectively activate fluorescent materials for data write-in, and then read out the information by imaging the fluorescent pattern. Despite the improved reading accuracy by combining with super-resolution microscopies, the use of fluorescent materials does not solve the problem of storage density, in which the write-in resolution is still limited by optical diffraction. Comparing with the method according to some embodiments of the disclosure, the writing and reading processes are performed in the expanded hydrogel, while the high storage density is achieved in the shrunk state. This means there is no trade-off between high read-out accuracy and high storage density. In addition, due to the limited lifetime of fluorescent materials, signal degradation and information loss during long-term storage are often observed. In comparison, as the fluorescent materials are only presented in the reading step of the method according to some embodiments of the disclosure, it is expected to have no signal degradation during long-term storage. In other words, the method according to some embodiments of the disclosure can take the advantage of high reading accuracy of fluorescent materials, but effectively avoid its drawbacks.

In the related art, newly developed materials with special optical properties have been applied as the storage media for 3D optical storage to elevate the storage time, reading accuracy, or storage density, e.g., surface-plasmon resonances of metallic nanoparticles, photon up-conversion of rare-earth-doped nanocrystals, and photostimulated luminescence (PSL) materials, etc. Yet, optical storage based on these materials are still in the preliminary stage of development. The achieved density is still far below the theoretical limit. For example, PSL has a storage density of ~130 Tbit/cm$^3$, but the achieved density is limited to several Tbit/cm$^3$, which is three orders of magnitude lower than the method according to some embodiments of the disclosure. Furthermore, the applications of such storage methods are typically limited by the high cost, low production efficiency, and limited stability of the storage mediums. In comparison, the method according to some embodiments of the disclosure uses low-cost hydrogel as the medium, which allows rapid information writing and reading by combining with high-throughput optical systems. The fully shrunk and dehydrated hydrogel is chemically stable, and can bear long term storage for years.

In the related art, the field of 3D optical storage faces three critical challenges that limit its applications and further development: (1) limited storage density and capacity due to the optical diffraction limit, where a storage density over 10 Tbit/cm$^3$ has rarely been realized; (2) limited writing and reading speeds due to the conventional point-by-point scanning optical system; and (3) the stored data are directly readable upon storage, which potentially compromises its security.

The method according to some embodiments of the disclosure can effectively address the above issues. Comparing with the 3D optical storage techniques (e.g., holographic storage, nanomaterial/DNA-based storage, or glass-based storage) in the related art, the method according to some embodiments of the disclosure has the following advantages: (1) substantially improving storage density beyond the optical diffraction limit (up to 180 Pbit/cm$^3$) via shrinking the storage media (i.e., hydrogel substrate) to create features down to 10 nm; (2) high writing/reading speed and accuracy by combining with suitable optical patterning/imaging systems; (3) enhancing storage security enabled by physically shrinking the substrate to nanometer level; and (4) the storage media are low cost.

Referring to FIG. 1, a method for writing and storing data according to some embodiments of the disclosure is shown. The method includes steps 101 and 102.

Step 101 includes patterning a hydrogel by illuminating a laser on the hydrogel.

In some embodiments, polyacrylate-based hydrogels are synthesized with modified concentrations of reactant solution. In some embodiments, the hydrogel is a crosslinked hydrophilic polymer. In some embodiments, a mixed solution of monomers (sodium acrylate (SA), acrylamide (AA), and bisacrylamide (Bis)) is prepared. The initiator, ammonium persulfate (APS), is added to a final concentration of 0.2% (w/w). In some embodiments, a gelling chamber is constructed by using 2 glass slides with two pieces of coverslips spacer (0.3 mm) at each end of the slide. The mixture is added to the gelling chamber, sealed with parafilm, and incubated overnight at 40-45° C. to produce the final hydrogel.

In some embodiments, a piece of hydrogel is trimmed to proper sizes and soaked in DI water or an aqueous solution of base (e.g., 0.1-100 mM NaOH solution) for expansion. After an incubation of 10-120 min at room temperature, the remaining solution is removed. The gel is then placed on a coverslip (which also serves as a window for laser patterning), and sealed in a chamber to minimize evaporation. Finally, a fs laser (e.g.,10-200 fs, 1 kHz-100 MHz, peak intensity: 0.1-50 TW/cm$^2$) is illuminated to the gel to write the designed patterns of information. When combined with high throughput optical patterning systems (e.g., fs light sheet patterning system.), the method can achieve a write-in speed up to 160 Mbit/s. For long-term storage, the patterned gel can be stored in DI water in a refrigerator at 4° C.

Step 102 includes shrinking the patterned hydrogel to encrypt and store the data.

In some embodiments, after information writing, physical encryption is realized by shrinking the patterned gel for up to 27,000 folds in volume. In the encrypted state, the optical storage device has a storage density of up to 180 Pbit/cm$^3$, which corresponds to a feature size of ~10 nm. As hydrogels are chemically stable after complete shrinking and dehydration, such devices can bear long-term storage for years.

In some embodiments, as acrylic acid-based hydrogels shrink in acid, the patterned gel is pre-shrunk in hydrochloric acid (4 mM or 4 mmol/L) before material deposition and then air-dried for long-time storage.

In some embodiments, hydrogels with different compositions can be shrunk for up to 30 folds in each dimension via any of the following methods:

(a) for polyacrylate/polyacrylamide-based gels: immersing in HCl solution (aq., 0.5-100 mM) for 10-60 min; or washing in 10× PBS for 15 min, and then in $MgCl_2$ solution (aq., 1-4 M) for 15 min.

(b) for other types of gels: immersing in HCl solution (aq., 1-100 mM) for 10-120 min; or washing with water doped (50-75%) ethanol or isopropanol for 10-30 min, and then pure ethanol or isopropanol for 0.5-2 hours; or washing in 1-10× PBS for 10-30 min, and then washing in $MgCl_2$ solution (aq., 1-4 M) for 5-30 min.

In some embodiments, after the shrinking, the hydrogel is air-dried via any of the following methods:

(a) the shrunk hydrogel is affixed to a thin metal wire, and then slowly air-dried at 4-80 Celsius degree.

(b) the shrunk hydrogel is left on a hydrophobic substrate (including but not limit to PTFE, PMMA, PFA, etc.) and air-dried.

Figure 2:
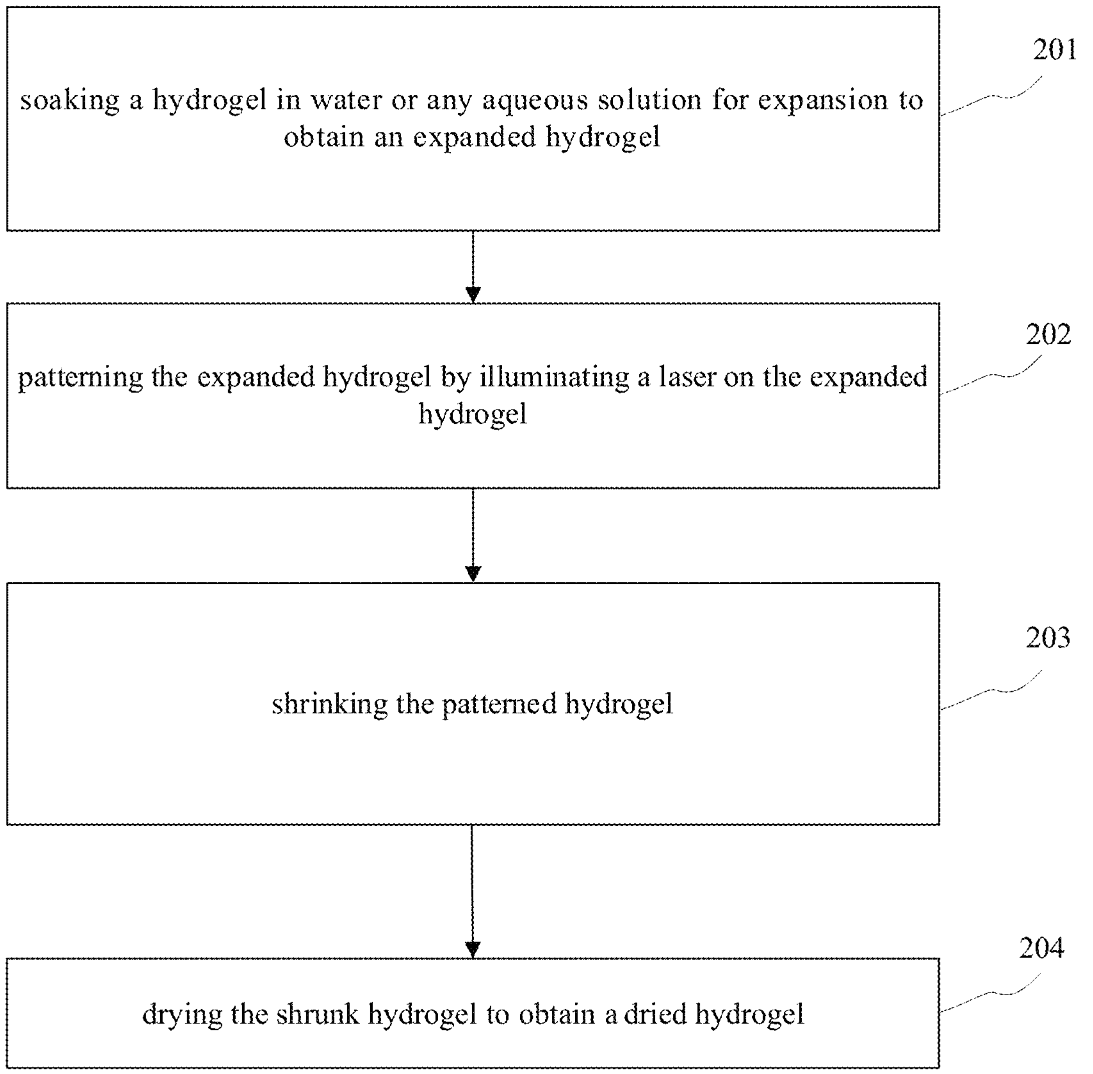
FIG. 2 illustrates a flow chart of a method for writing and storing data according to some other embodiments of the disclosure.

FIG. 2 shows a flow chart of a method for writing and storing data according to some other embodiments of the disclosure. The method includes steps 201 to 204. Step 201 includes soaking a hydrogel in water or any aqueous solution for expansion to obtain an expanded hydrogel. Step 202 includes patterning the expanded hydrogel by illuminating a laser on the expanded hydrogel. Step 203 includes shrinking the patterned hydrogel. Step 204 includes drying the shrunk hydrogel to obtain a dried hydrogel.

Figure 3:
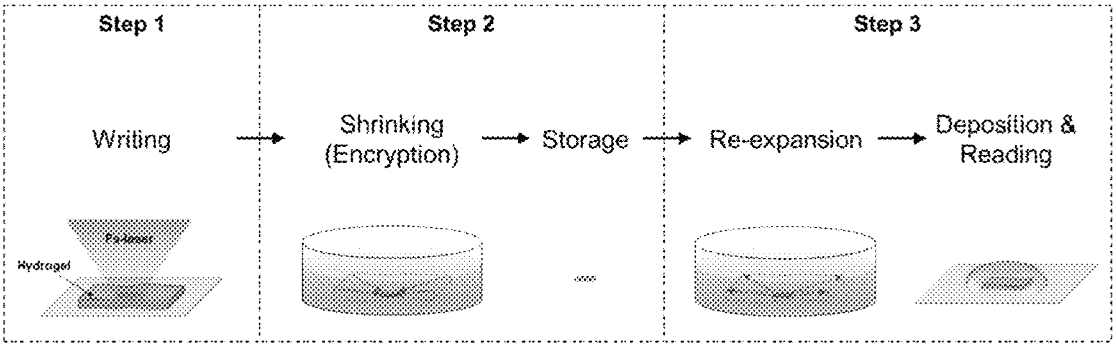
FIG. 3 illustrates a method of writing, storing, and reading data according to some embodiments of the disclosure.

FIG. 3 shows a method of writing, storing, and reading data according to some other embodiments of the disclosure.

In some embodiments, besides steps 1 and 2 (the same as steps 101 and 102), The method further includes step 3.

Step 3 includes: expanding the shrunk hydrogel to obtain an expanded hydrogel; depositing a contrast-generation material on the expanded hydrogel; and reading the pattern of the expanded hydrogel deposited with the contrast-generation material by using an optical imaging system.

In some embodiments, for decryption, the encrypted gel is re-expanded and deposited with fluorescent materials; and after that a high-speed fluorescent imaging system is applied to read out the stored information In some embodiments, for decryption, the dehydrated gel is first expanded in water or NaOH solution (0.01-100 mM) for 10-60 min, and then transferred into an aqueous solution of fluorescent materials to read the stored information. Applicable materials include but not limit to nanoparticles, quantum dots, fluorescent dyes, fluorescent biomaterials, etc. After 0.1-2 hours of incubation at room temperature, the remaining solution is removed. Finally, the information can be read out via an optical microscope. When a high-speed microscope is used (e.g., a temporal focusing microscope), an optical reading speed of up to 160 Mbit/s can be realized.

Figure 4:
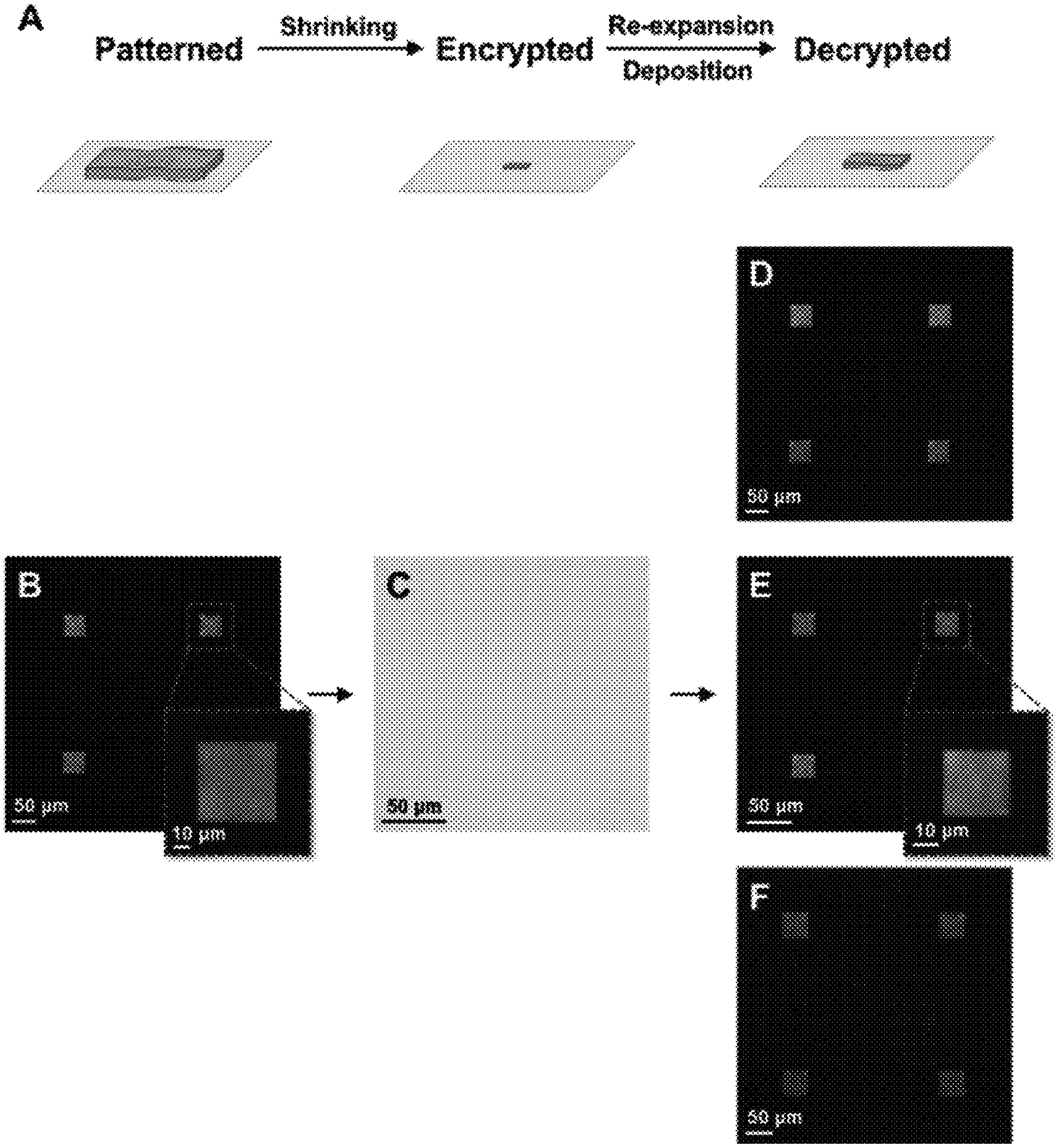
FIG. 4 illustrates an example of a method for storing and reading data according to some embodiments of the disclosure.

FIG. 4 shows an example of the method for storing and reading data according to some embodiments of the disclosure. Part A of FIG. 4 illustrates the fabrication of the optical storage device with physical encryption. Part B of FIG. 4 shows a fluorescent image of a patterned hydrogel that has been deposited with fluorescein. Part C of FIG. 4 shows an optical microscope image of a patterned, shrunk, and dehydrated hydrogel, where no patterns can be observed i.e., physically encrypted. Parts D to F of FIG. 4 show fluorescent images of patterns in re-expanded hydrogels deposited with fluorescein, fluorescent polystyrene spheres, and graphene QDs, respectively. The two patterns in parts B and D have similar contrast and brightness, indicating the re-expansion has no influence to the quality and accuracy of the optically stored information.

In some embodiments, an optical storage including a hydrogel with a pattern is provided. The hydrogel is expandable.

Figure 5:
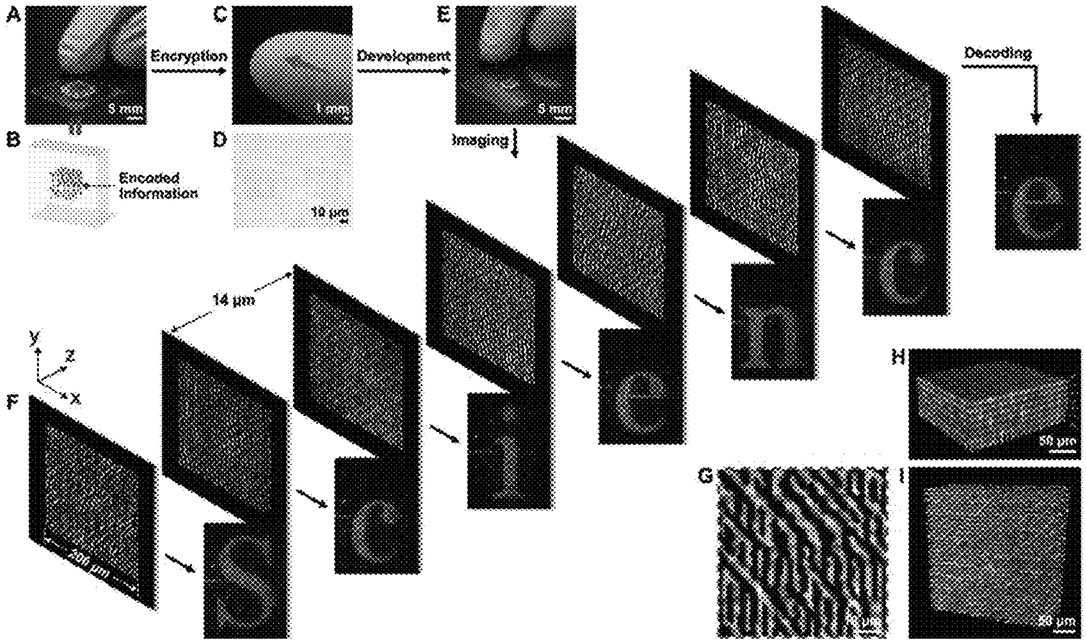
FIG. 5 illustrates an example of the method for storing and reading data according to some embodiments of the disclosure.

FIG. 5 shows an example of the method for storing and reading data according to some embodiments of the disclosure.

Part A of FIG. 5 shows a photo of a hydrogel with desired information patterned in it; part B shows an schematic of the expanded hydrogel patterned with designed information; part C shows the gel in part A after shrinking the dehydration to realize physical encryption; part D shows two encrypted 7-layer patterns in part C; part E shows that the re-expanded gel is deposited with CdSe and developed to decrypt the stored patterns; part F shows fluorescent images of the decrypted holograms, where "science" is decoded; and parts H and I show 3D views of the decrypted holograms.

Figure 6:
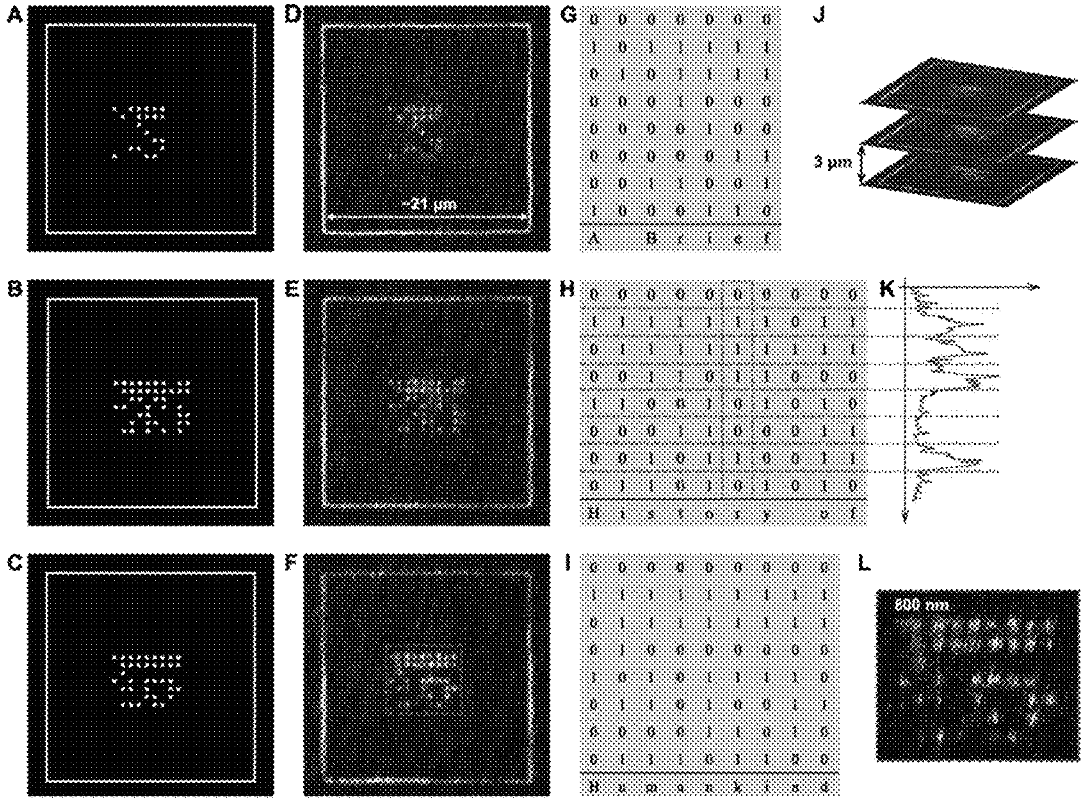
FIG. 6 illustrates an optically stored and read-out information according to some embodiments of the disclosure.

FIG. 6 illustrates an optically stored and read-out information according to some embodiments of the disclosure. In FIG. 6, "A Brief History of Humankind" is encoded by ASCII into three layers of binary matrix with a designed bit size of 800 nm/3 μm in lateral/axial dimensions, respectively (parts A-C of FIG. 6). The information pattern is written to a polyacrylate hydrogel using a fs light sheet patterning system with a writing speed of 160 Mbit/s. After shrinking the hydrogel for 13 folds, the bit size is reduced to 62 nm/230 nm in lateral/axial dimensions, which corresponds to a storage density of 1.14 $Pbit/cm^3$. Then, the stored information is recovered via the sequential operation of hydrogel re-expansion (in NaOH solution), deposition of CdSe QDs, and imaging with a confocal microscopy. As shown in parts D to F of FIG. 6, the information can be clearly read out from the grayscale intensity profiles (part K of FIG. 6). By writing patterns with smaller features, using hydrogels that can shrink for more folds, and imaging with super-resolution microscopies (e.g., structured illumination microscopy, stimulated emission depletion microscopy, etc.), the storage density can be further elevated to the theoretical value.

Parts A to C of FIG. 6 show designed images of the encoded information. Parts D to F of FIG. 6 show fluorescent images of each fabricated layer that corresponds to parts A-C (from confocal microscopy), where CdSe QDs are deposited for imaging. Tables in Parts G-I of FIG. 6 show the encoded words of parts A-C. Part J of 12 shows a 3D view of the fabricated patterns. Part K of FIG. 6 shows grey level profiles of the four dots that represent "r" across the dashed line in part E. Part L of FIG. 6 shows a zoom-in view of the smaller box in Part F.

The method and the optical storage according to some embodiments of the disclosure can provide an effective tool to reduce the physical volume of storing data. With the shrinkage of the storage medium, i.e., hydrogel substrate, the volume for storing the same amount of information is three orders of magnitude smaller than the solutions in the related art. More importantly, it serves as a practical solution for industrial application by combining with ultrafast writing and reading optical systems, which would be three orders of magnitude faster than the point-by-point scanning systems in the related art.

The foregoing is only a description of the preferred embodiments of the present disclosure and the applied technical principles. It should be appreciated by those skilled in the art that the inventive scope of the present disclosure is not limited to the technical solutions formed by the particular combinations of the above technical features. The inventive scope should also cover other technical solutions formed by any combinations of the above technical features or equivalent features thereof without departing from the concept of the invention, such as, technical solutions formed by replacing the features as disclosed in the present disclosure with (but not limited to), technical features with similar functions.

What is claimed is:

1. A method for storing data, the method comprising:

patterning a hydrogel by illuminating a laser on the hydrogel, wherein the laser is a femtosecond laser with a pulse duration of 10-200 femtoseconds; and shrinking the patterned hydrogel for data encryption and storage, wherein a peak intensity of the laser is 0.1 to 50 terawatts per square centimeter ($TW/cm^2$).

2. The method according to claim 1, wherein before patterning the hydrogel, the hydrogel is soaked in water or any aqueous solution for expansion to obtain an expanded hydrogel, and patterning the hydrogel comprises: patterning the expanded hydrogel.

3. The method according to claim 1, wherein a repetition rate of the laser is 1 kilohertz (kHz) to 100 megahertz (MHz).

4. The method according to claim 1, wherein the method further comprises: drying the shrunk hydrogel to obtain a dried hydrogel.

5. The method according to claim 1, wherein the method comprises:

expanding the shrunk hydrogel to obtain an expanded hydrogel;

depositing a contrast-generation material on the expanded hydrogel; and reading the pattern of the expanded hydrogel deposited with the contrast-generation material by using an optical imaging system.

6. The method according to claim 5, wherein depositing the contrast-generation material on the expanded hydrogel comprises: placing the expanded hydrogel into an aqueous solution of fluorescent materials.

7. An optical storage comprising:

a hydrogel with a pattern, wherein the hydrogel is expandable, wherein the pattern is formed by illuminating a femtosecond laser on the hydrogel and has a feature size of 10 nanometers (nm), and the femtosecond laser has a pulse duration of 10-200 femtoseconds (fs) and a peak intensity of 0.1 to 50 terawatts per square centimeter ($TW/cm^2$).

8. The optical storage according to claim 7, wherein the hydrogel is a crosslinked hydrophilic polymer.

9. The optical storage according to claim 7, wherein the optical storage comprises contrast-generation material deposited in 2D or 3D patterns of the hydrogel.

10. The optical storage according to claim 9, wherein the contrast-generation material comprises a dye or fluorescent material.

* * * * *